United States Patent [19]

Nicholls

[11] Patent Number: 4,860,166
[45] Date of Patent: Aug. 22, 1989

[54] INTEGRATED CIRCUIT TERMINATION DEVICE

[75] Inventor: Robin P. Nicholls, Santa Barbara, Calif.

[73] Assignee: Raytheon Company, Lexington, Mass.

[21] Appl. No.: 771,182

[22] Filed: Sep. 3, 1985

Related U.S. Application Data

[63] Continuation of Ser. No. 529,318, Sep. 6, 1983, abandoned.

[51] Int. Cl.[4] .............................................. H05K 1/14
[52] U.S. Cl. ................................... 361/414; 174/52.4; 361/395; 361/412
[58] Field of Search ..................... 174/52 FP, 524; 361/402, 414, 395, 393, 412

[56] References Cited

U.S. PATENT DOCUMENTS

| | | | |
|---|---|---|---|
| 3,316,619 | 5/1967 | Beelitz ........................... | 361/414 X |
| 3,558,993 | 1/1971 | Rigby ........................... | 174/52 FP |
| 3,588,616 | 6/1971 | Palazzini ........................... | 361/402 X |
| 3,710,195 | 1/1973 | Sada et al. ........................... | 361/386 X |
| 3,775,725 | 11/1973 | Endo ........................... | 361/414 X |
| 3,939,558 | 2/1976 | Riley ........................... | 174/52 FP X |
| 4,051,550 | 9/1977 | Seno et al. ........................... | 361/402 |
| 4,208,698 | 6/1980 | Narasimhan ........................... | 361/414 |
| 4,242,720 | 12/1980 | Moore ........................... | 361/402 |
| 4,328,531 | 5/1982 | Nagashima et al. ........................... | 361/414 X |
| 4,365,284 | 12/1982 | Tanaka ........................... | 361/395 |
| 4,423,468 | 12/1983 | Gatto et al. ........................... | 174/52 FP X |
| 4,437,140 | 3/1984 | Ohyama et al. ........................... | 174/68.5 |
| 4,439,754 | 3/1984 | Madden ........................... | 174/52 FP X |
| 4,464,704 | 8/1984 | Huie et al. ........................... | 361/414 |
| 4,493,145 | 1/1985 | Honda ........................... | 174/52 FP X |
| 4,539,622 | 9/1985 | Akasaki ........................... | 174/52 FP X |

*Primary Examiner*—R. R. Kucia
*Attorney, Agent, or Firm*—Edmund J. Walsh; Richard M. Sharkansky

[57] ABSTRACT

A resistor terminating device is provided comprising: a substrate; and, a plurality of resistors supported on the substrate, such plurality of resistors having a plurality of electrically isolated connecting first ends arranged for alignment in overlaying relationship with a plurality of electrical conductive connecting leads adapted for electrical connection to such resistors.

In a preferred embodiment of the invention, a printed circuit board is provided having disposed on a surface thereof a pattern of electrical conductors with ends thereof disposed in overlaying relationship with, and electrically connected to, a selected one, or ones, of the first electrode ends of the resistors. With such arrangement, a printed circuit board assembly is provided where on a first, upper surface thereof the integrated circuits are mounted and on an opposite, bottom surface thereof, a terminating device is provided, such terminating device having resistors available for termination by the integrated circuit, such termination device being disposed under the integrated circuit thereby allowing for relatively short interconnects between the integrated circuit and its terminating structure. Also, by disposing the termination device under the printed circuit board, additional upper surface space is available for mounting additional integrated circuits, or other electrical components.

7 Claims, 2 Drawing Sheets

INTEGRATED CIRCUIT TERMINATION DEVICE

This application is a continuation of application Ser. No. 529,318 filed Sept. 6, 1983 now abandoned.

BACKGROUND OF THE INVENTION

This invention relates generally to integrated circuit termination devices and more particularly to integrated circuit terminating devices adapted for use with high-speed digital logic integrated circuits.

As is known in the art high-speed digital logic integrated circuits, such as emitter coupled logic (ECL) integrated circuits, are adapted to operate at relatively high speeds. These components are typically mounted on a surface of a printed circuit board assembly for electrical interconnection to other electrical components and/or other integrated circuit components which are also mounted on the same surface of the printed circuit board. As is also known in the art the inputs to an emitter coupled logic circuit generally require termination to ground through a resistor. Thus, in addition to such printed circuit board having disposed on the surface thereof the integrated circuits themselves, the terminating resistors are generally also placed on this surface of the printed circuit board. The mounting of these resistors on the same surface of the printed circuit as the integrated circuits themselves thereby reduces the amount of space available on the printed circuit board for mounting the maximum number of integrated circuits of other electrical components. Further, as is also known in the art, it is also desirable to reduce the electrical interconnect lengths between the integrated circuits and electrical components in order to maximize the relatively high speed capability of these devices. Thus, it is desirable to provide an arrangement which maximizes the availability of the printed circuit board surface for mounting integrated circuits and which additionally minimizes the electrical interconnect lengths.

SUMMARY OF THE INVENTION

In accordance with the present invention, a resistor terminating device is provided comprising: a substrate; and, a plurality of resistors supported on the substrate, such plurality of resistors having a plurality of electrically isolated connecting first ends arranged for alignment in overlaying relationship with a plurality of electrical conductive connecting leads adapted for electrical connection to such resistors. In a preferred embodiment of the invention, a conductive bus is also supported on the substrate, such bus being electrically connected in common to second ends of the resistors.

In accordance with an additional feature of the invention an interconnecting arrangement is provided comprising: an integrated circuit, having a plurality of electrical conductive leads disposed in a predetermined pattern; and, a substrate having a plurality of resistors disposed thereon, such resistors having first electrode ends disposed in overlaying relationship with, and electrically connected to, a selected one, or ones, of the plurality of electrical conductive leads.

In a preferred embodiment of the invention, a printed circuit board is provided having disposed on a surface thereof a pattern of electrical conductors with ends thereof disposed in overlaying relationship, with, and electrically connected to, a selected one, or ones, of the first eletrode ends of the resistors. With such arrangement, a printed circuit board assembly is provided where on a first, upper surface thereof the integrated circuits are mounted and on an opposite, bottom surface thereof, a terminating device is provided, such terminating device having resistors available for termination by the integrated circuit, such termination device being disposed under the integrated circuit thereby allowing for relatively short interconnects between the integrated circuit and its terminating structure. Also, by disposing the termination device under the printed circuit board, additional upper surface space is available for mounting additional integrated circuits, or other electrical components.

BRIEF DESCRIPTION OF THE DRAWINGS

The foregoing features of this invention, as well as the invention itself, may be more fully understood from the following detailed description read together with the accompanying drawings, in which.

DESCRIPTION OF THE PREFERRED EMBODIMENT

Figure 1:
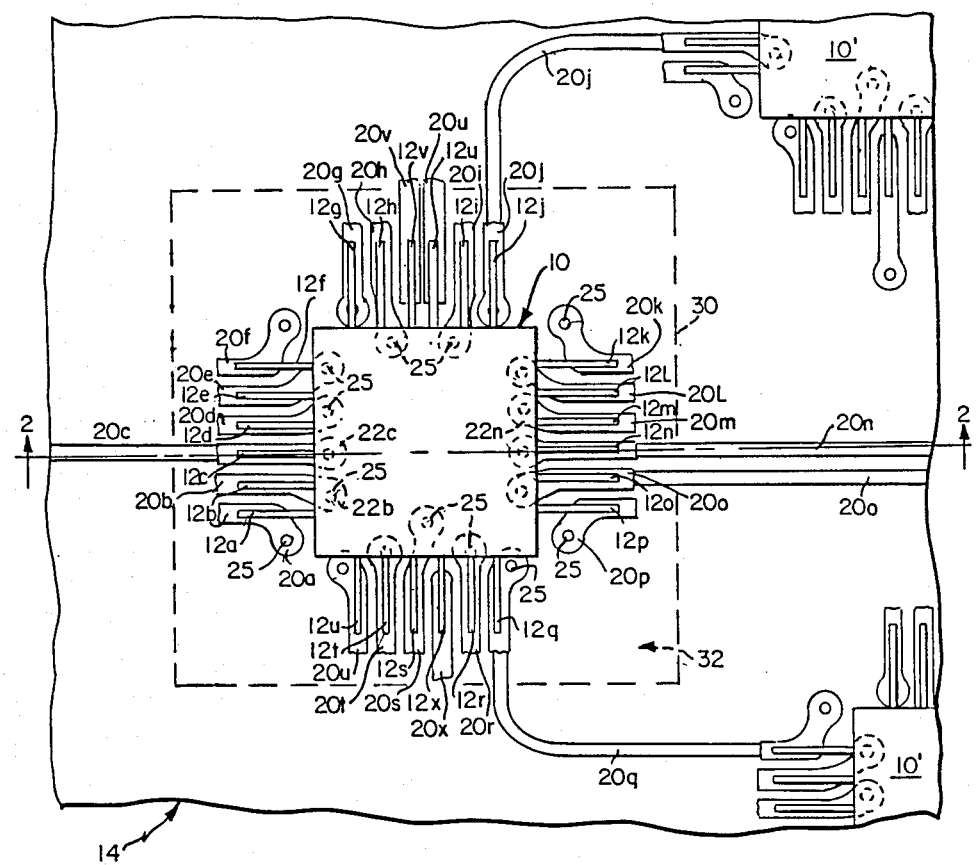
FIG. 1 is a plan view of a printed circuit board assembly electrically connecting a plurality of integrated circuits, such circuits being terminated with a resistor termination device according to the invention.
Figure 2:
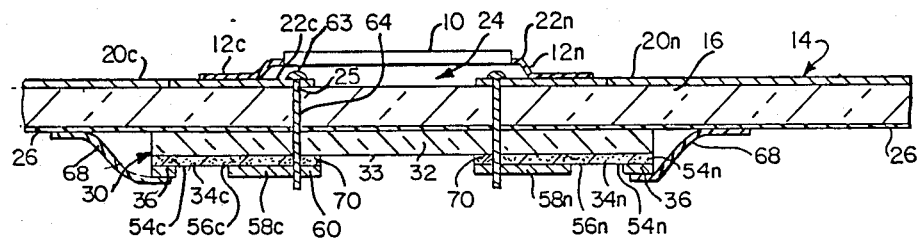
FIG. 2 is a cross-sectional view taken along line 2—2 of FIG. 1.
Figure 3:
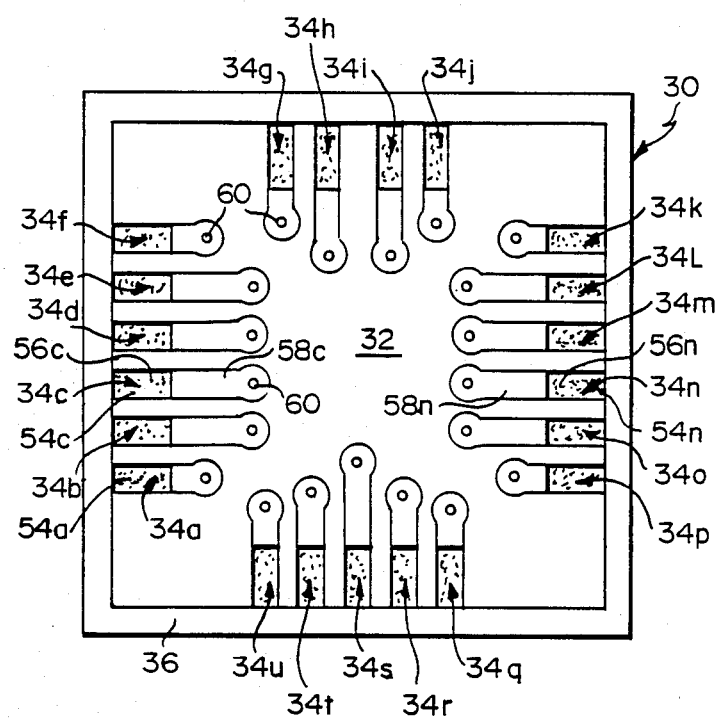
FIG. 3 is a plan view of the resistor termination device used in FIG. 1.

Referring now to FIGS. 1, 2 and 3 an integrated circuit 10, here an emitter coupled logic circuit packaged in a conventional "flat-pack" package, is adapted for electrical connection via a plurality of, here 24, strip lead (i.e. ribbon) conductors 12a-12x which extend beyond the periphery package 10 in a conventional manner, as shown. Further, it is noted that leads 12a-12u are adapted for connection of input or outputs while 12v-12x are adapted for connection to power sources. The integrated circuit 10 is mounted on, and electrically connected to, other electrical components 10' via a conventional printed circuit board assembly 14, as shown.

The printed circuit board assembly 14 includes a dielectric substrate 16 having etched on the upper planar surface thereof a pattern of electrical interconnecting conductors 20a-20x with ends 22a-22u of conductors 20a-20u terminating in a rounded terminating region having central apertures 25. The ends 22a-22u of the electrical interconnecting conductors 20a-20x are arranged in a predetermined pattern about the region 24 of the printed circuit board 14 where the integrated circuit package 10 is to be disposed. More particularly, the ends 22a-22x of the electrical interconnecting connectors 20a-20x are arranged so that when the integrated circuit 10 is placed on the printed circuit board 14, the strip lead conductors 20a-20x extending beyond the package 10 lie on top of the terminating region 22a-22x of the electrical interconnecting conductors 20a-20x, respectively, as shown. On the opposite, here bottom, surface of the printed circuit board 14 is a conductive ground plane layer 26.

Disposed under the printed circuit board 14 is a resistor terminating device 30, such resistor terminating device 30 comprises a planar dielectric substrate 32 having disposed on the bottom planar surface thereof a plurality, here 21, of resistors 34a-34u. Disposed around the outer periphery of the bottom surface 33 of the planar dielectric substrate 32 is a conductive bus formed on such bottom surface 33 dielectric substrate 32. A first electrode end 54a–54u of each of the plurality of resistors 34a–34u is electrically connected in common to the peripherally disposed conductive bus 36. The opposite electrode ends 56a–56u of the resistors 34a–34u are dielectrically separated from each other by the dielectric substrate 32. Thus, each one of the resistors 34a–34u thereby has its own electrically isolated terminating, or end, electrode 58a–58u, respectively, as shown. The terminating electrodes 58a–58u are disposed on the bottom surface 32 of substrate 32 and are arranged in a pattern so that they align in underlying relationship with the terminating ends 22a–22u, respectively, of the printed circuit board interconnecting conductors 20. Each one of the terminating electrodes 58a–58u the resistors are provided with apertures 60, as shown, so that the apertures 25 of ends 22a–22x are disposed directly over apertures 60 of electrodes 58a–58u, respectively. The resistor terminating device 30 is disposed beneath the ground plane layer 26 of the printed circuit board 14. It is noted that the bottom surface of the substrate 32 is totally dielectric and therefore will not electrically interconnect with ground plane layer 26 of the printed circuit board.

The resistor terminating device 30 here has a fiberglass resin substrate (here G-10 Micaply Material manufactured by (Mica Corporation, 10900 Washington Road, Culver City, CA). The dielectric 30 is coated with a layer 70 of resistive material, here tin oxide having a sensitivity of 25 to 200 ohms per square. Disposed over the layer 70 of the oxide is a layer 72 of conductor material, here a layer of copper, plated on the layer 70 of the oxide. Conventional photolithographic-chemical etching techniques are then used to pattern the conductive layer 72 and the resistive layer 70. Here the individual resistors 34a–34u are formed by selectively etching away, here with ferric chloride, all of the copper layer 72 except those portions of layer 72 forming the conductive bus 36 and the terminating electrodes 58a–58u, thus, exposing portions of the resistive layer 70. Next, all of the exposed resistive layer 70 is removed using chromic acid except for those portions forming the resistors 34a–34u.

In order to terminate a selected one, or ones, of the strip lead conductors 12a–12u of the integrated circuit package 10, (for example, strip lead conductor 22c) prior to disposing the integrated circuit package 10 on printed circuit board 14, a hole is drilled through an aperture 24 of end 22c through the underlying portion of the dielectric substrate 16, underlying ground plane layer 26, and through the portion of dielectric substrate 52 and finally through aperture 60 of electrode 58c. A conductive pin 64 is then inserted through the drilled hole with such pin 64 then the head 63 of such pin 64 is suitably soldered to the apertured end 22c of and the bottom portion 65 of pin 64 is soldered to electrode 58c, as indicated. This process is repeated for terminating each selected one, or ones, of the strip lead conductors 12a–12u. Having thus connected a selected one, or ones, of the strip lead conductors 12a–12u desired for resistive termination, the integrated circuit component 12 is then disposed over the region 24 with the strip lead conductors 12a–12x disposed on ends 22a–22x of conductors 20a–22x, respectively, as shown The strip lead conductors 12a–12x are then soldered to corresponding one of the ends 22a–22x of the electrical interconnecting conductors 20a–20x. The pins 64 now extend through the terminating device 30. Next, the protruding ends of pins 64 are cut to the desired length. Finally, the conductive bus 36 is electrically connected to the ground plane layer 26. This electrical connection is here made by a ground strap 68 which is soldered to bus 36 and layer 26. Alternatively, the bus 36 may be soldered to the layer 26 directly.

Having described preferred embodiments of the invention, other embodiments incorporating these concepts may be used. It is felt, therefore, that this invention should not be restricted to the disclosed embodiments, but rather should be limited only by the spirit and scope of the appended claims.

What is claimed is:

1. A termination device for an integrated circuit, the integrated circuit being packaged in a package mounted on a printed circuit board, such package having a plurality of electrical conductor connecting leads, said termination device comprising:
    (a) a substrate disposed externally of the package and the printed circuit board, such substrate being attachable to the printed circuit board; and
    (b) a plurality of resistors supported on the substrate, such plurality of resistors having a plurality of electrically isolated connecting first ends arranged for alignment in overlaying relationship with the plurality of electrical conductor connecting leads of the integrated circuit package for electrical connection to the first ends of such resistors.

2. The combination recited in claim 1 including a conductive bus supported in such substrate, such bus being electrically connected to second ends of the resistors.

3. In combination:
    (a) an integrated circuit packaged in a package having a plurality of electrical conductive leads disposed in a predetermined pattern, said package being mounted on a printed circuit board; and
    (b) a discrete termination device for said integrated circuit packaged in said package, said printed circuit board being disposed between the package and the discrete termination device, said discrete termination device comprising a substrate having a plurality of resistors disposed thereon, such resistors having first ends disposed in overlaying relationship with and being selectively connected to a selected one or ones of the plurality of electrical conductive leads.

4. In combination:
    (a) a printed circuit board having disposed on a first surface thereof a predetermined pattern of electrical conductors with terminating ends thereof disposed in a predetermined array around a peripheral portion of a region on the first surface;
    (b) a dielectric substrate, said dielectric substrate being mountable on, and removable from, a second surface of the printed circuit board, said dielectric substrate having a plurality of resistors disposed thereon, such resistors having first ends disposed in underlying relationship with the terminating ends of the electrical conductors; and
    (c) means passing through the printed circuit board and the dielectric substrate for electrically connecting a selected one, or ones, of the terminating ends with the underlying one, or ones, of the first ends of the resistors.

5. The combination recited in claim 4 including an integrated circuit package disposed over the region on the first surface of the printed circuit board and having a plurality of electrical conductive leads disposed on, and electrically connected to the terminating ends.

6. In combination:
   an integrated circuit package having a plurality of electrical conductor connecting leads;
   a printed circuit board having disposed on a first surface thereof a plurality of electrical conductors with terminating end portions thereof disposed in a predetermined pattern, the integrated circuit package being disposed over the first surface with the electrical conductor connecting leads of the package contacting the terminating end portions;
   a dielectric substrate disposed externally of the package and the printed circuit board, such dielectric substrate having disposed thereon a plurality of resistors having first end portions disposed in said predetermined pattern in underlying relationship with the terminating end portions of the electrical conductors, such dielectric substrate being disposed under a second surface of the pg,21 printed circuit board with the first end portions of the plurality of resistors being separated from the terminating end portions of the plurality of electrical conductors by the printed circuit board; and
   electrically conducting pin means passing through the printed circuit board for electrically coupling a selected one, or ones, of the plurality of terminating end portions with the underlying one, or ones, of the first end portions of the resistors.

7. the combination of claim 6 wherein the unselected one, or ones, of the plurality of terminating end portions are electrically insulated from the underlying one, or ones, of the first end portions of the resistors by the printed circuit board.

* * * * *